(12) United States Patent
Cheng et al.

(10) Patent No.: US 9,859,291 B2
(45) Date of Patent: Jan. 2, 2018

(54) NON-VOLATILE MEMORY AND MANUFACTURING METHOD THEREOF

(71) Applicants: IoTMemory Technology Inc., Taipei (TW); Tzung-Wen Cheng, Taipei (TW); Yu-Ming Cheng, Taipei (TW)

(72) Inventors: Tzung-Wen Cheng, Taipei (TW); Yu-Ming Cheng, Taipei (TW)

(73) Assignees: IoTMemory Technology Inc., Taipei (TW); Tzung-Wen Cheng, Taipei (TW); Yu-Ming Cheng, Taipei (TW)

( * ) Notice: Subject to any disclaimer, the term of this patent is extended or adjusted under 35 U.S.C. 154(b) by 32 days.

(21) Appl. No.: 14/817,187

(22) Filed: Aug. 3, 2015

(65) Prior Publication Data

US 2017/0040334 A1  Feb. 9, 2017

(51) Int. Cl.
*H01L 27/115* (2017.01)
*H01L 27/11524* (2017.01)

(52) U.S. Cl.
CPC .............................. *H01L 27/11524* (2013.01)

(58) Field of Classification Search
CPC ............. H01L 27/115; H01L 27/11524; H01L 29/42328; H01L 21/28273; H01L 29/7883; H01L 29/42324; H01L 29/42344
See application file for complete search history.

(56) References Cited

U.S. PATENT DOCUMENTS

| | | | | |
|---|---|---|---|---|
| 5,338,952 A | * | 8/1994 | Yamauchi | ............. H01L 27/115 257/316 |
| 5,402,374 A | * | 3/1995 | Tsuruta | .................. G11C 16/16 257/316 |
| 5,414,286 A | * | 5/1995 | Yamauchi | ............. H01L 27/115 257/315 |
| 5,915,176 A | * | 6/1999 | Lim | .................. H01L 27/11517 257/322 |
| 5,946,240 A | * | 8/1999 | Hisamune | ............. H01L 27/115 257/316 |

(Continued)

FOREIGN PATENT DOCUMENTS

TW   M502247 U   *   6/2015
TW   M1513458         12/2015

OTHER PUBLICATIONS

"Office Action of Taiwan Counterpart Application", issued on Aug. 22, 2016, p. 1-p. 3.

*Primary Examiner* — Bitew Dinke
(74) *Attorney, Agent, or Firm* — Jianq Chyun IP Office

(57) ABSTRACT

A non-volatile memory having memory cells is provided. A stacked gate structure has gate dielectric layer, assist gate, insulation layer, and erase gate disposed in order. The floating gate is disposed on a first sidewall of the stacked gate structure, the floating gate has a corner portion at the top portion, and erase gate covers the corner portion. The tunneling dielectric layer is disposed under the floating gate. The erase gate dielectric layer is disposed between the erase gate and the floating gate. The assist gate dielectric layer is disposed between the assist gate and the floating gate. The source region and the drain region are respectively disposed at two sides of the stacked structure and the floating gate. The control gate is disposed on the source region and the floating gate. The inter-gate dielectric layer is disposed between the control gate and the floating gate.

15 Claims, 9 Drawing Sheets

(56) References Cited

U.S. PATENT DOCUMENTS

| | | | | |
|---|---|---|---|---|
| 6,009,011 A | * | 12/1999 | Yamauchi | H01L 27/115 257/E27.103 |
| 6,037,223 A | * | 3/2000 | Su | H01L 27/11521 257/E21.682 |
| 6,121,087 A | * | 9/2000 | Mann | H01L 27/105 257/E21.689 |
| 6,133,098 A | * | 10/2000 | Ogura | G11C 11/5621 257/E21.682 |
| 6,178,113 B1 | * | 1/2001 | Gonzalez | G11C 11/5621 257/316 |
| 6,476,440 B1 | * | 11/2002 | Shin | G11C 16/0433 257/316 |
| 6,635,533 B1 | * | 10/2003 | Chang | H01L 27/115 257/E21.682 |
| 7,611,941 B1 | * | 11/2009 | Shum | H01L 21/28273 257/E21.179 |
| 8,617,951 B2 | * | 12/2013 | Matsuzaki | H01L 27/115 438/201 |
| 2003/0087493 A1 | * | 5/2003 | Jenq | H01L 27/11521 438/265 |
| 2004/0046204 A1 | * | 3/2004 | Choi | H01L 27/115 257/315 |
| 2004/0087084 A1 | * | 5/2004 | Hsieh | H01L 27/11521 438/257 |
| 2005/0012137 A1 | * | 1/2005 | Levi | H01L 27/115 257/315 |
| 2005/0036393 A1 | * | 2/2005 | Jenq | H01L 21/28273 365/232 |
| 2006/0027853 A1 | * | 2/2006 | Kanamori | H01L 27/115 257/314 |
| 2007/0183222 A1 | * | 8/2007 | Kanamori | H01L 27/115 365/185.29 |
| 2007/0221982 A1 | * | 9/2007 | Ikeda | H01L 27/115 257/314 |
| 2008/0083945 A1 | * | 4/2008 | Klinger | H01L 27/115 257/319 |
| 2014/0097480 A1 | * | 4/2014 | Shum | H01L 27/11521 257/314 |
| 2014/0269102 A1 | * | 9/2014 | Hewitt | G11C 16/0416 365/185.29 |
| 2015/0214315 A1 | * | 7/2015 | Fan | H01L 27/11521 257/321 |

* cited by examiner

NON-VOLATILE MEMORY AND MANUFACTURING METHOD THEREOF

BACKGROUND OF THE INVENTION

Field of the Invention

The invention relates to a semiconductor device and a manufacturing method thereof. More particularly, the invention relates to a non-volatile memory and a manufacturing method thereof.

Description of Related Art

Since a non-volatile memory can, for instance, repeatedly perform operations such as storing, reading, and erasing data, and since stored data is not lost after the non-volatile memory is shut down, the non-volatile memory has been extensively applied in personal computers and electronic equipment.

A traditional structure of non-volatile memory has a stack-gate structure, including a tunneling oxide layer, a floating gate, an inter-gate dielectric layer, and a control gate disposed on a substrate in order. When a programming or erasing operation is performed on such a flash memory device, a suitable voltage is respectively applied to the source region, the drain region, and the control gate, such that electrons are injected into a polysilicon floating gate, or electrons are pulled out from the polysilicon floating gate.

In the operation of the non-volatile memory, a greater gate-coupling ratio (GCR) between the floating gate and the control gate generally means a lower operating voltage is needed for the operation, and the operating speed and the efficiency of the flash memory are significantly increased as a result. In particular, methods of increasing the gate coupling ratio include, for instance, increasing the overlap area between the floating gate and the control gate, reducing the thickness of the dielectric layer between the floating gate and the control gate, and increasing the dielectric constant (k) of the inter-gate dielectric layer between the floating gate and the control gate.

However, as the integrated circuit is being developed into a device with smaller size by increasing the density thereof, the size of the memory cells of the non-volatile memory needs to be reduced to increase the density of the non-volatile memory. In particular, the reduction in the size of the memory cells can be achieved by, for instance, a method such as reducing the gate length of the memory cells or reducing the spacing of the bit lines. However, a reduced gate length causes reduction in the channel length below the tunneling oxide layer, and therefore abnormal punch through readily occurs between the source and the drain. As a result, the electrical performance of the memory cells is significantly affected. Moreover, when programming or erasing memory cells, electrons repeatedly pass through the tunneling oxide layer, thus causing wear to the tunneling oxide layer, and as a result, the reliability of the memory device is reduced.

SUMMARY OF THE INVENTION

The invention provides a non-volatile memory and a manufacturing method thereof. The non-volatile memory is capable of operating in a low operating voltage, thus increasing the reliability of a semiconductor device.

The invention provides a non-volatile memory and a manufacturing method thereof capable of increasing the density of a device.

The invention provides a non-volatile memory having a first memory cell disposed on a substrate. The first memory cell has a stacked gate structure, a floating gate, a tunneling dielectric layer, an erase gate dielectric layer, an assist gate dielectric layer, a source region, a drain region, a control gate, and an inter-gate dielectric layer, wherein the stacked gate structure has a gate dielectric layer, an assist gate, an insulation layer, and an erase gate disposed on the substrate in order. The floating gate is disposed on a sidewall of the first side of the stacked gate structure, the top portion of the floating gate has a corner portion, and the erase gate covers the corner portion. The tunneling dielectric layer is disposed between the floating gate and the substrate. The erase gate dielectric layer is disposed between the erase gate and the floating gate. The assist gate dielectric layer is disposed between the assist gate and the floating gate. The source region and the drain region are respectively disposed in the substrate at two sides of the stacked gate structure and the floating gate, wherein the source region is adjacent to the floating gate, the drain region is adjacent to the second side of the stacked gate structure, and the first side and the second side are opposite to each other. The control gate is disposed on the source region and the floating gate. The inter-gate dielectric layer is disposed between the control gate and the floating gate and between the control gate and the erase gate.

In an embodiment of the invention, the non-volatile memory further has a second memory cell. The second memory cell is disposed on the substrate, the structure of the second memory cell is the same as the structure of the first memory cell, and the second memory cell and the first memory cell are disposed as mirror images of each other, and share the source region or the drain region.

In an embodiment of the invention, the first memory cell and the second memory cell share the control gate, and the control gate is completely filled in an opening between the first memory cell and the second memory cell.

In an embodiment of the invention, the non-volatile memory further has a third memory cell. The third memory cell is disposed on the substrate, the structure of the third memory cell is the same as the structure of the first memory cell, the third memory cell and the first memory cell share the source region, the assist gate, the erase gate, and the control gate, and the control gate is completely filled between the floating gate of the first memory cell and the floating gate of the third memory cell.

In an embodiment of the invention, the tunneling dielectric layer is further disposed between the control gate and the source region.

In an embodiment of the invention, the material of the assist gate dielectric layer includes silicon oxide/silicon nitride, silicon oxide/silicon nitride/silicon oxide, or silicon oxide.

In an embodiment of the invention, the material of the insulation layer includes silicon oxide. The material of the inter-gate dielectric layer includes silicon oxide/silicon nitride/silicon oxide, silicon nitride/silicon oxide, or other high-dielectric constant materials (dielectric constant k>4).

In an embodiment of the invention, the material of the tunneling dielectric layer includes silicon oxide, and the thickness of the tunneling dielectric layer is between 60 angstroms and 200 angstroms.

In an embodiment of the invention, the material of the gate dielectric layer includes silicon oxide, and the thickness of the gate dielectric layer is less than or equal to the thickness of the tunneling dielectric layer. The material of the erase gate dielectric layer includes silicon oxide, and the thickness of the erase gate dielectric layer is between 100 angstroms and 180 angstroms.

In an embodiment of the invention, the angle of the corner portion of the floating gate is less than or equal to 90 degrees.

The invention provides a manufacturing method of a non-volatile memory including the following steps. First, a substrate is provided. Then, at least two stacked structures are formed on the substrate, and each of the stacked structures includes a gate dielectric layer, an assist gate, an insulation layer, and a sacrificial layer on the substrate in order. Then, an assist gate dielectric layer is formed on a sidewall of each of the stacked structures, and a tunneling dielectric layer is formed on the substrate between the stacked structures. A floating gate is formed on a sidewall of the first side of each of the stacked structures, wherein the top portion of the floating gate has a corner portion, and the corner portion is adjacent to the sacrificial layer. A material layer is formed on the substrate completely filled in a gap between the stacked structures. A portion of the material layer, a portion of the insulation layer, and a portion of the assist gate dielectric layer are removed after the sacrificial layer is removed to form an opening at least exposing the corner portion of the floating gate. An erase gate dielectric layer is formed on at least the corner portion of the floating gate. An erase gate completely filled in the opening is formed on the substrate, wherein the erase gate covers the corner portion of the floating gate. The material layer is removed to form an inter-gate dielectric layer on the floating gate and the erase gate. A control gate is formed on the floating gate.

In an embodiment of the invention, the step of forming the floating gate on the sidewall of the first side of each of the stacked structures includes a step of forming a conductive spacer on the sidewall of the first side of each of the stacked structures; and patterning the conductive spacer to form the floating gate. In an embodiment of the invention, the step of forming the conductive spacer on the sidewall of the first side of each of the stacked structures includes: forming a conductive layer on the substrate; and performing an anisotropic etching process on the conductive layer.

In an embodiment of the invention, the manufacturing method of a non-volatile memory further includes a step forming a source region in the substrate between the conductive spacers; and a step of forming a drain region in the substrate at the second side of each of the stacked structures, wherein the first side and the second side are opposite to each other.

In the non-volatile memory and the manufacturing method thereof of the invention, the structures of two adjacent memory cells in the X direction (horizontal direction) are same and the two memory cells are, for instance, disposed as mirror images of each other, and the two memory cells share the source region or the drain region, and share the control gate. The structures of two adjacent memory cells in the Y direction (vertical direction) are the same, and the two memory cells share the source region, the assist gate (word line), the erase gate, and the control gate. Therefore, the density of the device can be increased.

In the non-volatile memory and the manufacturing method thereof of the invention, the assist gate and the erase gate are disposed parallel to each other, and therefore the density of the device can be increased.

In the non-volatile memory of the invention, the thickness of the gate dielectric layer below the assist gate is less, and during the operation of the memory cells, a smaller voltage can be used to open/close the channel region below the assist gate. That is, the operating voltage can be reduced.

In the non-volatile memory and the manufacturing method thereof of the invention, the control gate covers the floating gate, and therefore the area between the control gate and the floating gate can be increased, such that the coupling ratio of the memory device is increased.

In the non-volatile memory and the manufacturing method thereof of the invention, the floating gate has a corner portion, and the erase gate covers the corner portion. The angle of the corner portion is less than or equal to 90 degrees and an electric field can be concentrated via the corner portion, and therefore the erase voltage can be reduced, thus effectively pulling out electrons from the floating gate, and as a result the speed of erasing data is increased.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
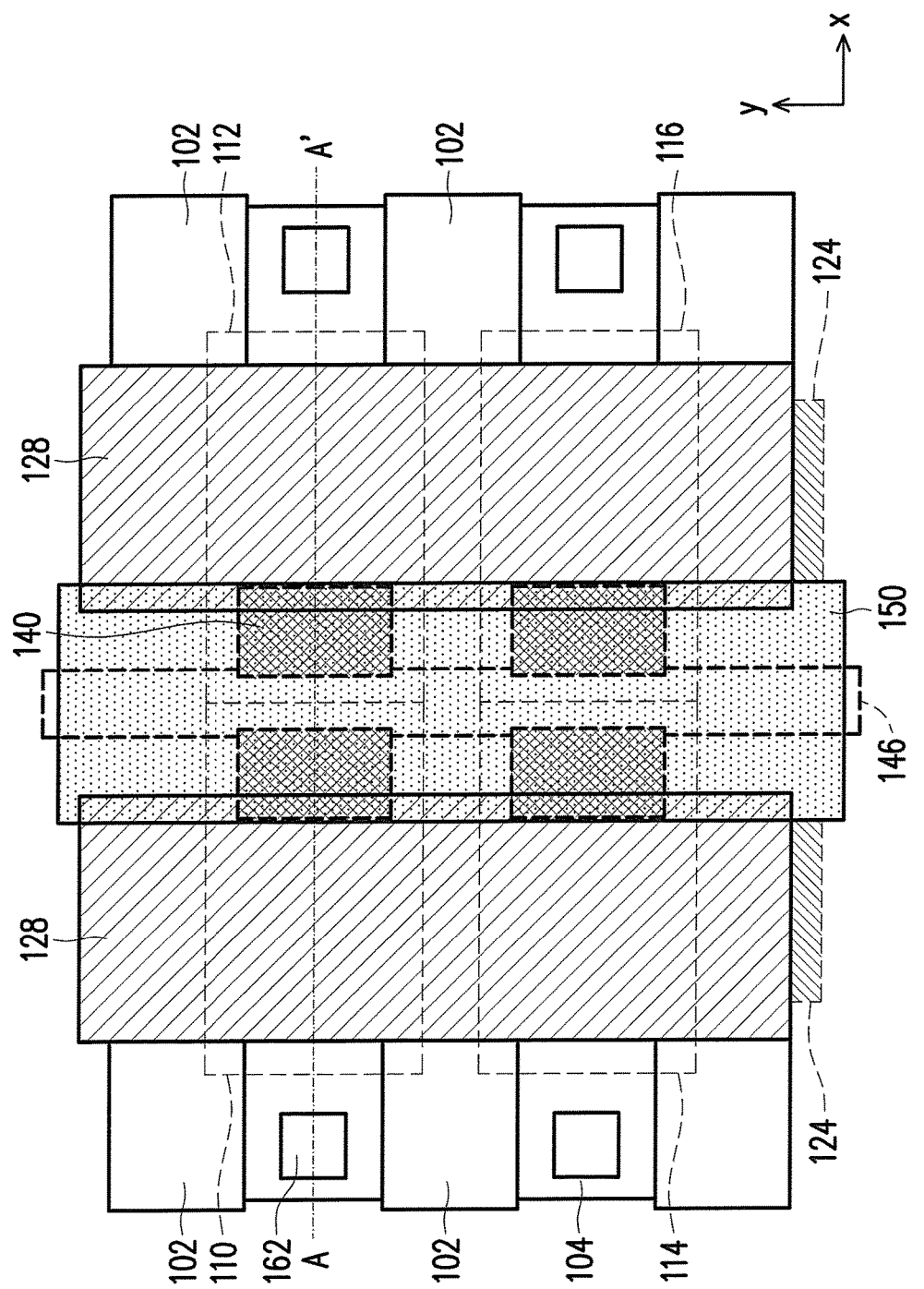
FIG. 1A is a top view of a non-volatile memory illustrated according to an embodiment of the invention.
Figure 1B:
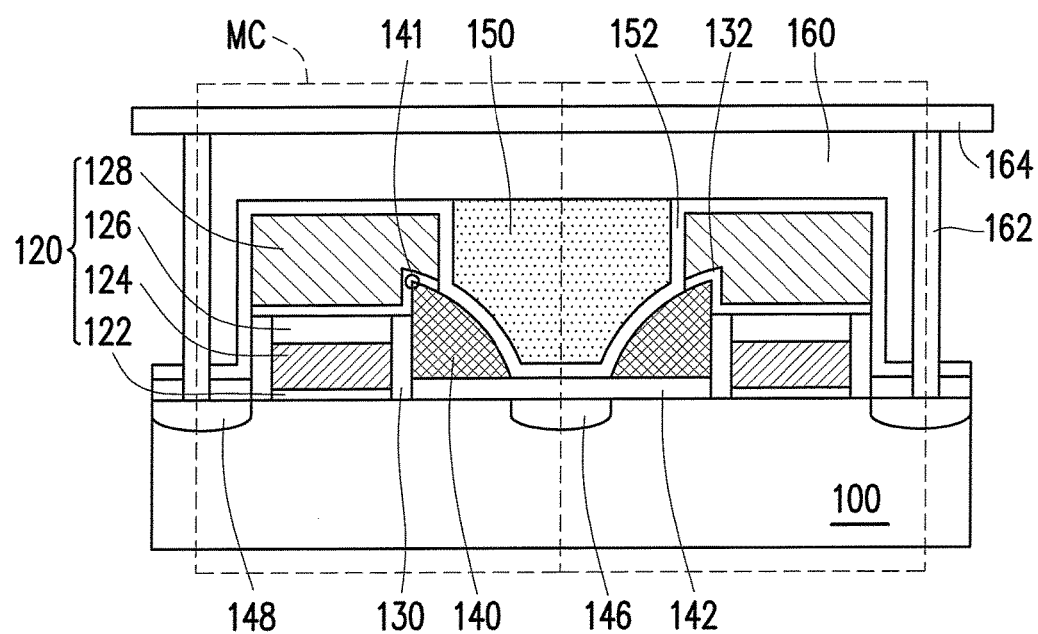
FIG. 1B is a cross-sectional view of a non-volatile memory illustrated according to an embodiment of the invention.

FIG. 1A is a top view of a non-volatile memory illustrated according to an embodiment of the invention. FIG. 1B is a cross-sectional view of a non-volatile memory illustrated according to an embodiment of the invention. FIG. 1B illustrates a cross-sectional view along line A-A' in FIG. 1A.

Referring to FIG. 1A and FIG. 1B, a non-volatile memory includes a plurality of memory cells MC. The memory cells MC are arranged into a row/column array.

The non-volatile memory is disposed on a substrate 100. A plurality of isolation structures 102 regularly arranged is exemplarily disposed in the substrate 100 to define an active region 104 having a square shape. The isolation structures 102 are, for instance, shallow trench isolation structures.

Each of the memory cells MC includes a stacked gate structure 120, an assist gate dielectric layer 130, an erase gate dielectric layer 132, a floating gate 140, a tunneling dielectric layer 142, a source region 146, a drain region 148, a control gate 150, and an inter-gate dielectric layer 152. Moreover, an interlayer insulation layer 160, a plug 162, and a bit line 164 are further disposed on the substrate 100.

The stacked gate structure 120 is formed by a gate dielectric layer 122, an assist gate (word line) 124, an insulation layer 126, and an erase gate 128 from the substrate 100 in order. The gate dielectric layer 122 is, for instance, disposed between the assist gate 124 and the substrate 100. The material of the gate dielectric layer 122 is, for instance, silicon oxide. The thickness of the gate dielectric layer 122 is, for instance, less than or equal to the thickness of the tunneling dielectric layer 142.

The assist gate 124 is, for instance, disposed between the gate dielectric layer 122 and the insulation layer 126. The erase gate 128 is, for instance, disposed on the insulation layer 126. The assist gate 124 and the erase gate 128 are, for instance, extended in the Y direction. The material of each of the assist gate 124 and the erase gate 128 is, for instance, a conductive material such as doped polysilicon. The insulation layer 126 is, for instance, disposed between the assist gate 124 and the erase gate 128. The material of the insulation layer 126 is, for instance, silicon oxide.

The assist gate dielectric layer 130 is, for instance, disposed between the floating gate 140 and the assist gate 124. The material of the assist gate dielectric layer 130 is, for instance, silicon oxide/silicon nitride/silicon oxide or silicon nitride/silicon oxide. The thickness of the assist gate dielectric layer 130 is, for instance, greater than or equal to the thickness of the erase gate dielectric layer 132. The erase gate dielectric layer 132 is, for instance, disposed between the erase gate 128 and the floating gate 140. The material of the erase gate dielectric layer 132 is, for instance, silicon oxide. The thickness of the erase gate dielectric layer 132 is, for instance, between 100 angstroms and 180 angstroms. The erase gate dielectric layer 132 is, for instance, further disposed between the erase gate 128 and the assist gate 124.

The floating gate 140 is, for instance, disposed on a sidewall of the first side of the stacked gate structure 120, and the top portion of the floating gate 140 has a corner portion 141. The erase gate 128 covers the corner portion 141 of the floating gate 140. The angle of the corner portion 141 is less than or equal to 90 degrees. The material of the floating gate 140 is, for instance, a conductive material such as doped polysilicon. The floating gate 140 can be formed by one or a plurality of conductive layers.

The tunneling dielectric layer 142 is, for instance, disposed between the floating gate 140 and the substrate 100. The tunneling dielectric layer 142 is, for instance, further disposed between the control gate 150 and the source region 146. The material of the tunneling dielectric layer 142 is, for instance, silicon oxide. The thickness of the tunneling dielectric layer 142 is between 60 angstroms and 200 angstroms.

The source region 146 is, for instance, disposed in the substrate 100 next to the floating gate 140. The drain region 148 is, for instance, disposed in the substrate 100 at the second side of the stacked gate structure 120, wherein the first side and the second side are opposite to each other. The source region 146 and the drain region 148 are, for instance, doped regions containing an N-type or P-type dopant as decided according to the design of the device.

The control gate 150 is, for instance, disposed on the source region 146 and the floating gate 140. The control gate 150 is, for instance, extended in the Y direction (vertical direction). The material of the control gate 150 is, for instance, a conductive material such as doped polysilicon. The inter-gate dielectric layer 152 is, for instance, disposed between the control gate 150 and the floating gate 140. The material of the inter-gate dielectric layer 152 is, for instance, silicon oxide/silicon nitride/silicon oxide, silicon nitride/silicon oxide, or other high-dielectric constant materials (k>4).

The interlayer insulation layer 160 is, for instance, disposed on the substrate 100 and covers the first memory cell 110 and the second memory cell 112. The material of the interlayer insulation layer 160 is, for instance, silicon oxide, phosphosilicate glass, borophosphosilicate glass, or other suitable dielectric materials. The plug 162 is, for instance, disposed in the interlayer insulation layer 160, and the plug 162 and the drain region 148 are electrically connected. The material of the plug 162 is, for instance, a conductive material such as aluminum or tungsten. The bit line 164 is, for instance, disposed on the interlayer insulation layer 160, and the bit line 164 is electrically connected to the drain region 148 via the plug 162. The material of the bit line 164 is, for instance, a conductive material such as aluminum, tungsten, or copper.

In the X direction (horizontal direction), the plurality of memory cells MC is grouped together in series via the source region 146 or the drain region 148. For instance, the structure of the memory cell 110 and the structure of the memory cell 112 are the same, and the memory cell 110 and the memory cell 112 are disposed as mirror images of each other and share the source region 146 or the drain region 148; the structure of the memory cell 114 and the structure of the memory cell 116 are the same, and the memory cell 114 and the memory cell 116 are disposed as mirror images of each other and share the source region 146 or the drain region 148. At the same time, the memory cell 110 and the memory cell 112 share the control gate 150, and the control gate 150 is completely filled between the memory cell 110 and the memory cell 112; the memory cell 114 and the memory cell 116 share the control gate 150, and the control gate 150 is completely filled between the memory cell 114 and the memory cell 116.

In the Y direction (vertical direction), the plurality of memory cells MC is grouped together in series via the source region 146, the assist gate (word line) 124, the erase gate 128, and the control gate 150. That is, in the vertical direction, the plurality of memory cells MC share the same source region 146, the assist gate (word line) 124, the erase gate 128, and the control gate 150. For instance, the structure of the memory cell 110 and the structure of the memory cell 114 are the same, the structure of the memory cell 112 and the structure of the memory cell 116 are the same, and the control gate 150 is completely filled between the floating gate 140 of the memory cell 110 and the floating gate 140 of the memory cell 114, and between the floating gate 140 of the memory cell 112 and the floating gate 140 of the memory cell 116. The memory cell 114 and the first memory cell 110 in the same column share the same source region 146, assist gate (word line) 124, erase gate 128, and control gate 150.

In the above non-volatile memory, the structures of two adjacent memory cells MC in the X direction (horizontal direction) are the same and the two memory cells are, for instance, disposed as mirror images of each other, and the two memory cells share the source region 146 or the drain region 148, and share the control gate 150. The structures of two adjacent memory cells MC in the Y direction (vertical direction) are the same, and the two memory cells share the source region 146, the assist gate (word line) 124 (124*a*), the erase gate 128, and the control gate 150. Therefore, the density of the device can be increased.

In the above non-volatile memory, the assist gate and the erase gate are disposed as a stacked gate structure, and therefore the density of the device can be increased.

In the above non-volatile memory, the thickness of the gate dielectric layer 122 is less, and during the operation of the memory cells, a smaller voltage can be used to open/close the channel region below the assist gate 124. That is, the operating voltage can be reduced. The control gate 150 covers the floating gate 140, and therefore the area between the control gate 150 and the floating gate 140 can be increased, such that the coupling ratio of the memory device is increased. The floating gate 140 has the corner portion 141. The erase gate 128 covers the corner portion 141, the angle of the corner portion 141 is less than or equal to 90 degrees, and an electric field can be concentrated via the corner portion 141, and therefore the erase voltage can be reduced, thus effectively pulling out electrons from the floating gate 140, and as a result the speed of erasing data is increased.

FIG. 2A to FIG. 2H are cross-sectional views of the manufacturing process of a non-volatile memory illustrated according to an embodiment of the invention.

Figure 2A:
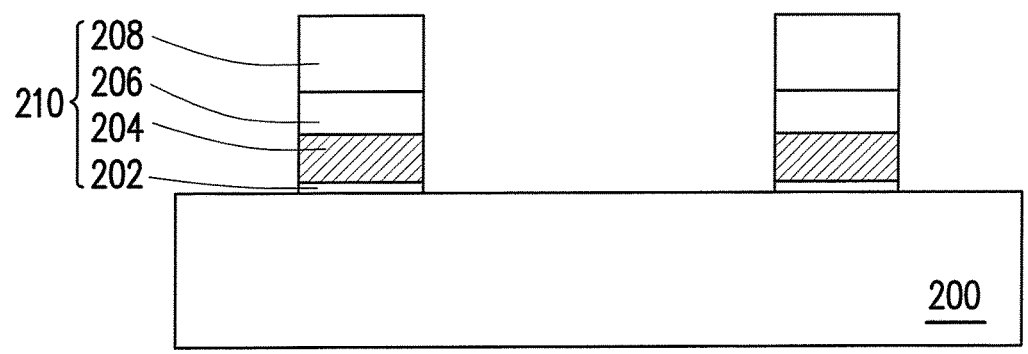
FIG. 2A to FIG. 2I are cross-sectional views of the manufacturing process of a non-volatile memory illustrated according to an embodiment of the invention.

First, referring to FIG. 2A, a substrate 200 is provided. Then, a dielectric layer 202, a conductive layer 204, an insulation layer 206, and a sacrificial layer 208 are formed on the substrate 200 in order. The material of the dielectric layer 202 is, for instance, silicon oxide, and the forming method thereof is, for instance, a thermal oxidation method. The material of the conductive layer 204 is, for instance, doped polysilicon or polycide. When the material of the conductive layer 204 is doped polysilicon, the forming method thereof includes, for instance, performing an ion implantation step after an undoped polysilicon layer is formed via a chemical vapor deposition method; or performing a chemical vapor deposition method with an in-situ dopant implantation method. The material of the insulation layer 206 is, for instance, silicon oxide, and the forming method thereof is, for instance, a chemical vapor deposition method. The material of the sacrificial layer 208 has a different etch selectivity than the material of the insulation layer 206, and includes, for instance, silicon nitride, and the forming method thereof is, for instance, a chemical vapor deposition method.

Then, the sacrificial layer 208, the insulation layer 206, the conductive layer 204, and the dielectric layer 202 are patterned to form at least two stacked structures 210. The method of forming the at least two stacked structures 210 includes, for instance, first forming a patterned photoresist layer (not shown) on the substrate 200, and the forming method of the patterned photoresist layer includes, for instance, first forming a photoresist material layer on the entire substrate 200, and then performing exposure and development. Then, a portion of the sacrificial layer 208, the insulation layer 206, the conductive layer 204, and the dielectric layer 202 are removed by using the patterned photoresist layer as a mask to form the at least two stacked structures 210. Next, the patterned photoresist layer is removed. The method of removing the patterned photoresist layer is, for instance, a wet photoresist stripping method or a dry photoresist stripping method. In particular, the dielectric layer 202 is used as the gate dielectric layer. The conductive layer 204 is used as the assist gate (word line).

Figure 2B:
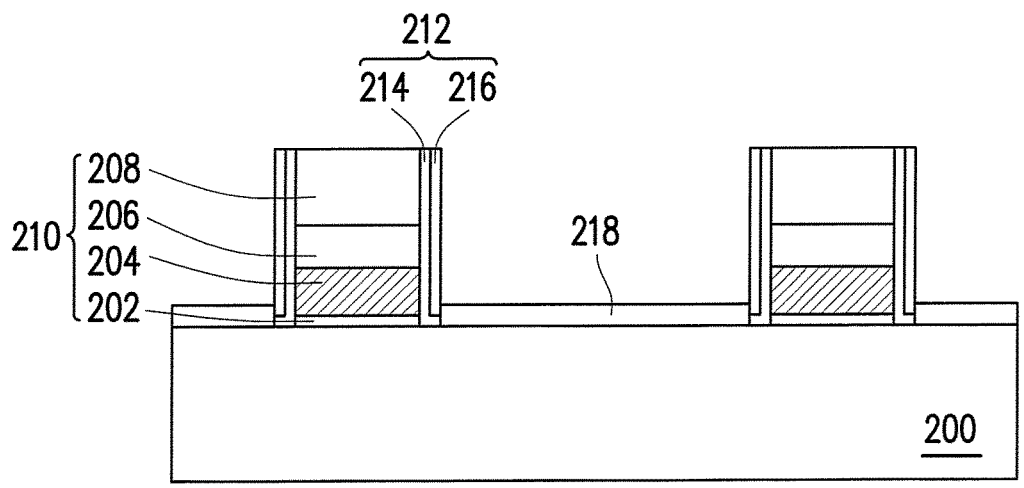

Referring to FIG. 2B, an isolation material layer 212 is formed on a sidewall of each of the stacked structures 210. The material of the isolation material layer 212 is, for instance, silicon oxide/silicon nitride/silicon oxide or silicon nitride/silicon oxide. The forming method of the isolation material layer 212 includes, for instance, first forming a dielectric layer 214 and a dielectric layer 216 covering each of the stacked structures 210 on the substrate 200 in order, and then removing a portion of the dielectric layer 214 and the dielectric layer 216 to form the isolation material layer 212 on the sidewall of each of the stacked structures 210. The material of the dielectric layer 214 is, for instance, silicon nitride, and the material of the dielectric layer 216 is, for instance, silicon oxide. The forming method of the dielectric layer 214 and the dielectric layer 216 is, for instance, a chemical vapor deposition method. The method of removing a portion of the dielectric layer 214 and the dielectric layer 216 is, for instance, an anisotropic etching method.

Then, a tunneling dielectric layer 218 is formed on the substrate 200 between each of the stacked structures 210. The material of the tunneling dielectric layer 218 is, for instance, silicon oxide, and the forming method thereof is, for instance, a thermal oxidation method.

Figure 2C:
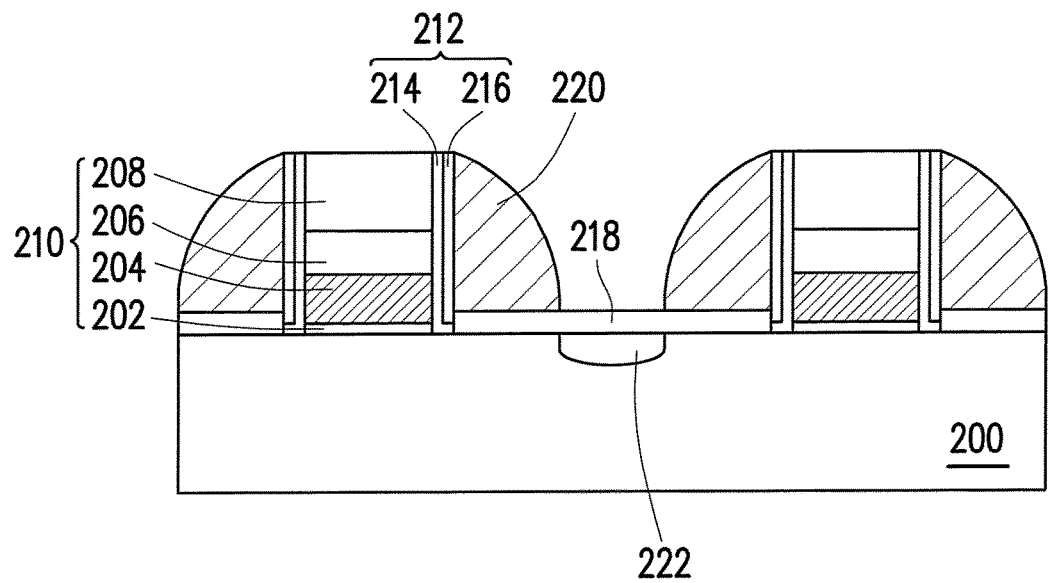

Referring to FIG. 2C, a conductive spacer 220 is formed on the sidewall of each of the stacked structures 210.

The forming method of the conductive spacer 220 includes the following steps. First, a conductive layer (not shown) is formed on the substrate 200. The material of the conductive layer is, for instance, doped polysilicon or polycide. When the material of the conductive layer is doped polysilicon, the forming method thereof includes, for instance, performing an ion implantation step after an undoped polysilicon layer is formed via a chemical vapor deposition method; or performing a chemical vapor deposition method with an in-situ dopant implantation method. Then, a portion of the conductive layer is removed. The method of removing a portion of the conductive layer is, for instance, an anisotropic etching method or an etch-back method.

Then, a source region 222 is formed in the substrate 200 between the conductive spacers 220. That is, the source region 222 is formed in the substrate 200 next to the conductive spacer 220 of the first side of each of the stacked structures 210. The forming method of the source region 222 includes, for instance, performing an ion implantation process by using the conductive spacer 220 of the first side as a mask. The implanted dopant can be an N-type or P-type dopant as decided according to the design of the device.

Figure 2D:
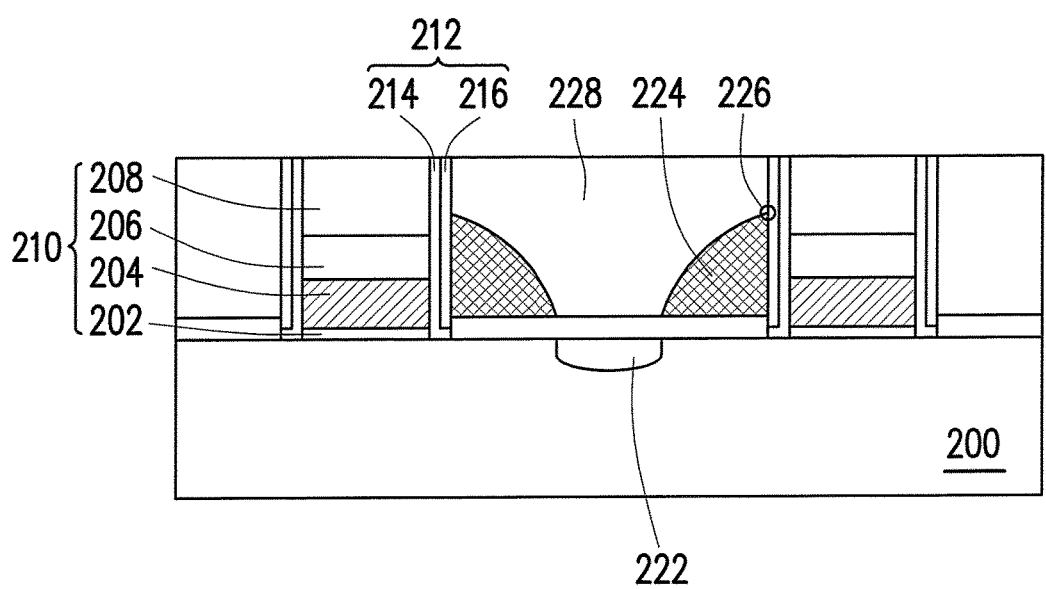

Referring to FIG. 2D, the conductive spacer 220 is patterned to form a floating gate 224. The method of patterning the conductive spacer 220 is as follows. A patterned photoresist layer (not shown) is formed on the substrate 200. The forming method of the patterned photoresist layer includes, for instance, first forming a photoresist material layer on the entire substrate 200, and then performing exposure and development. A portion of the conductive spacer 220 of the first side is removed by using the patterned photoresist layer as a mask to form the conductive spacer 220 into a block shape, and the conductive spacer 220 of the second side of each of the stacked structures 210 is removed, wherein the second side and the first side are opposite to each other. The patterned photoresist layer is then removed. The top portion of the floating gate 224 has a corner portion 226. Then, a portion of the floating gate 224 is removed such that the corner portion 226 is adjacent to the sacrificial layer 208. That is, the height of the corner portion 226 falls within the height of the sacrificial layer 208.

Then, a material layer 228 is formed on the substrate 200 to completely fill the gap between the stacked structures 210. The material of the material layer 228 is, for instance, silicon oxide, and the forming method thereof is, for instance, a chemical vapor deposition method.

Figure 2E:
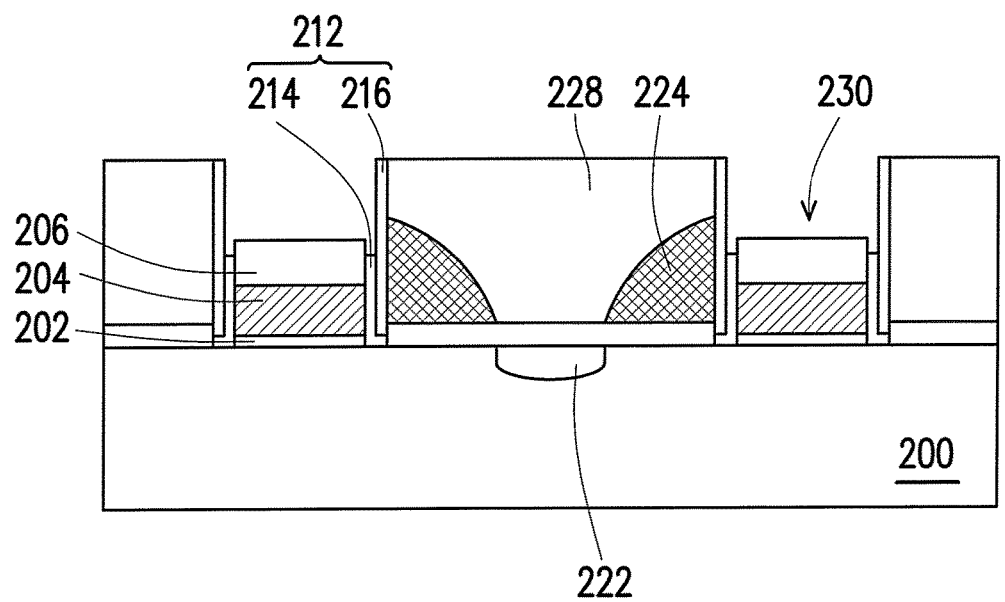

Referring to FIG. 2E, the sacrificial layer 208 is removed, and a portion of the dielectric layer 214 is removed to form an opening 230. The method of removing the sacrificial layer 208 and a portion of the dielectric layer 214 is, for instance, a wet etching method or a dry etching method.

Figure 2F:
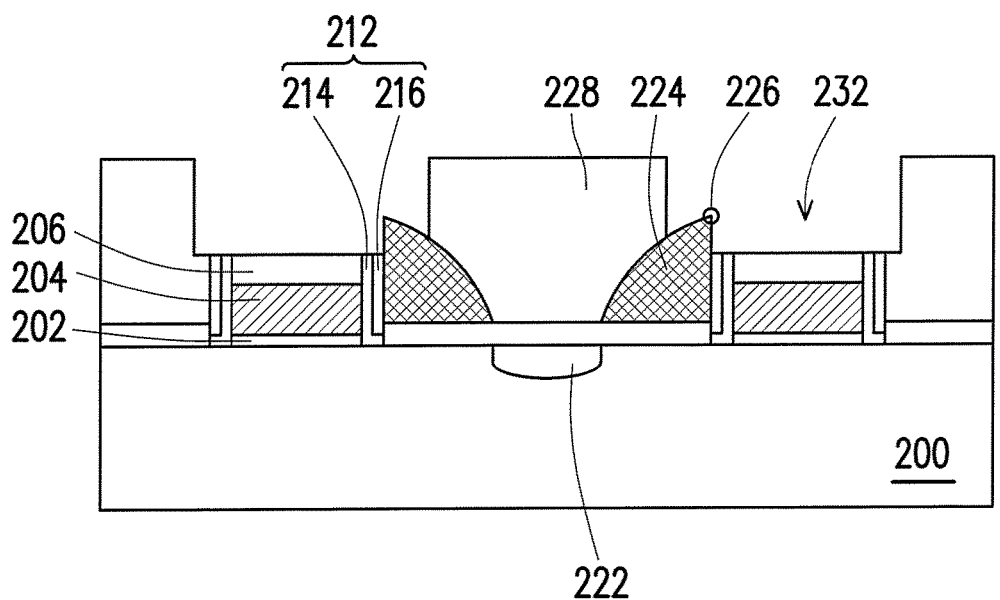

Referring to FIG. 2F, a portion of the material layer 228, a portion of the insulation layer 206, and a portion of the dielectric layer 216 are removed to form an opening 232. The opening 232 at least exposes the corner portion 226 of the floating gate 224. The method of removing a portion of the material layer 228, a portion of the insulation layer 206, and a portion of the dielectric layer 216 is, for instance, a wet etching method or a dry etching method. At this point, the isolation material layer 212 between the floating gate 224 and the conductive layer 204 is used as the assist gate dielectric layer.

Figure 2G:
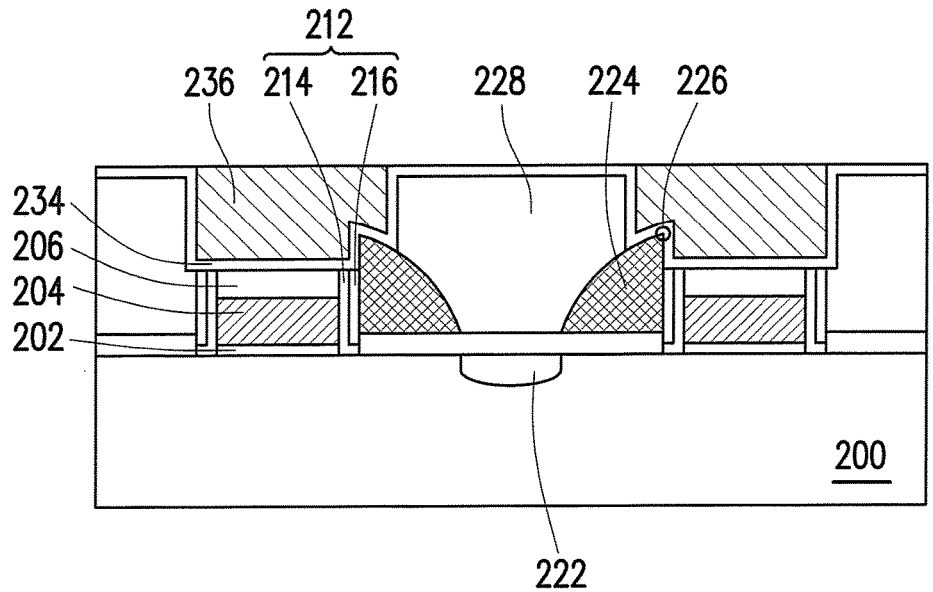

Referring to FIG. 2G, an erase gate dielectric layer 234 is formed on the substrate 200. The material of the erase gate dielectric layer 234 is, for instance, silicon oxide. The forming method of the erase gate dielectric layer 234 is, for instance, a chemical vapor deposition method. An erase gate 236 completely filled in the opening 232 is formed on the substrate 200. The forming method of the erase gate 236 is as follows: a conductive layer (not shown) completely filled in the opening 232 is formed on the substrate 200, and then the portion of the conductive layer outside of the opening 232 is removed. The material of the conductive layer is, for instance, doped polysilicon or polycide. When the material of the conductive layer is doped polysilicon, the forming method thereof includes, for instance, performing an ion implantation step after an undoped polysilicon layer is formed via a chemical vapor deposition method; or performing a chemical vapor deposition method with an in-situ dopant implantation method. The method of removing the portion of the conductive layer outside of the opening 232 includes, for instance, an etch-back method or a chemical-mechanical polishing method.

Figure 2H:
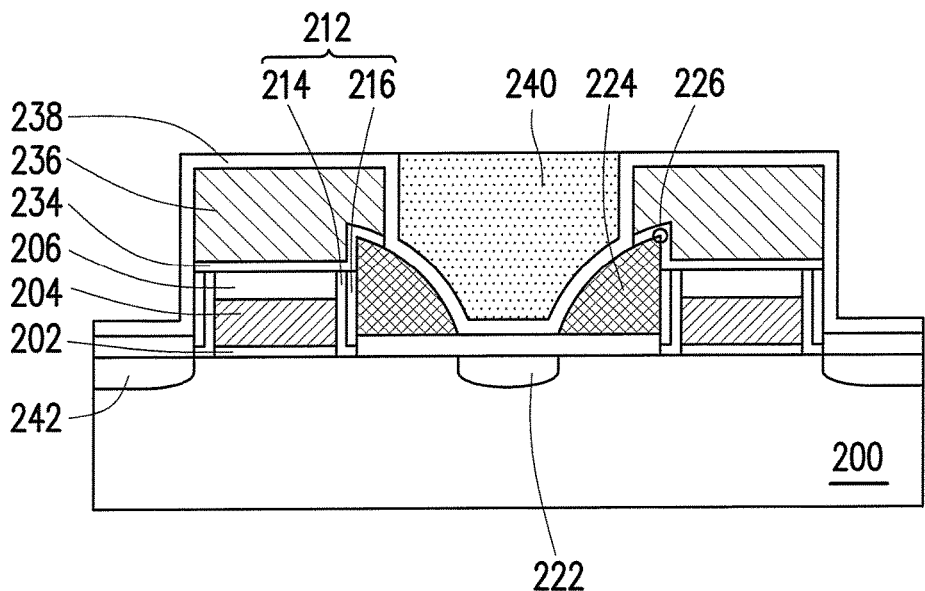

Referring to FIG. 2H, a portion of the erase gate dielectric layer 234 is removed, and the material layer 228 is removed. The method of removing a portion of the erase gate dielectric layer 234 and the material layer 228 is, for instance, a wet etching method or a dry etching method.

Then, an inter-gate dielectric layer 238 is formed on the substrate 200, wherein the inter-gate dielectric layer 238 covers the floating gate 224 and the erase gate 236. The material of the inter-gate dielectric layer 238 includes, silicon oxide/silicon nitride/silicon oxide. The forming method of the inter-gate dielectric layer 238 includes, for instance, forming a silicon oxide layer, a silicon nitride layer, and another silicon oxide layer in order using a chemical vapor deposition method. The material of the inter-gate dielectric layer 238 can also be silicon nitride/silicon oxide or other high-dielectric constant materials (k>4).

Then, a control gate 240 is formed on the floating gate 224. The material of the control gate 240 is, for instance, doped polysilicon or polycide. The forming method of the control gate 240 includes, for instance, first forming a conductive layer (not shown) on the substrate, and then patterning the conductive layer to form the control gate 240. The forming method of the conductive layer is, for instance, a chemical vapor deposition method.

Then, a drain region 242 is formed in the substrate 200 next to the second side of each of the stacked structures 210. The forming method of the drain region 242 includes, for instance, performing an ion implantation process. The implanted dopant can be an N-type or P-type dopant as decided according to the design of the device. The dopants and the doping concentrations of the source region 222 and the drain region 242 can be the same and can also be different.

Figure 2I:
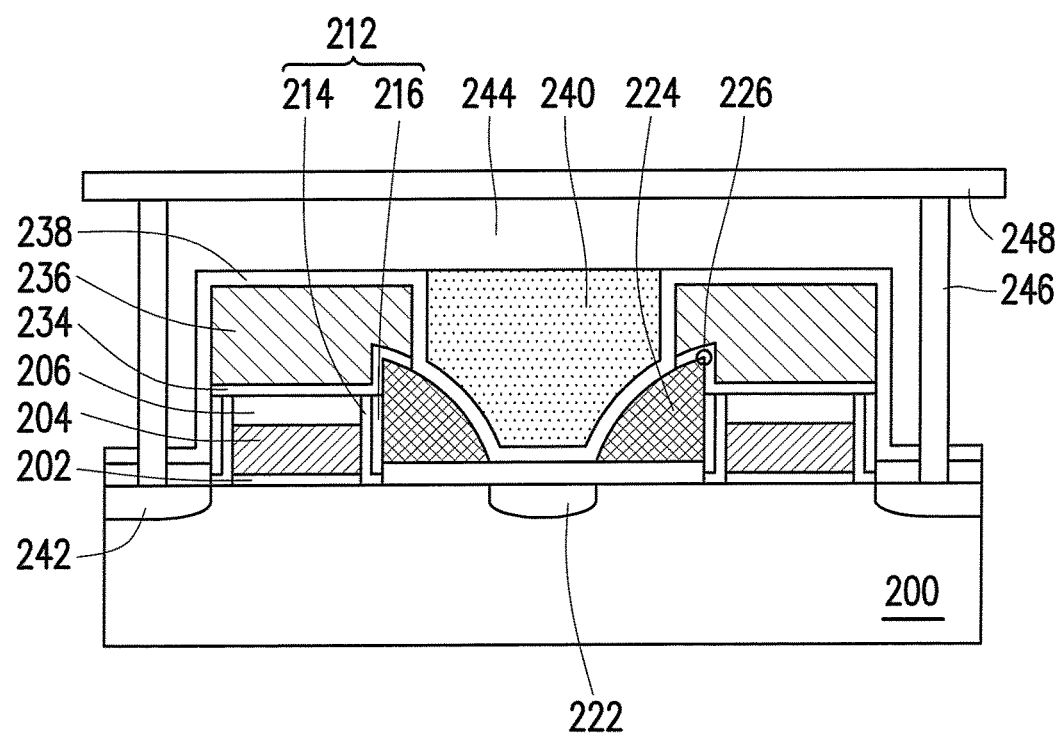

Referring to FIG. 2I, an interlayer insulation layer 244 is formed on the substrate 200. The material of the interlayer insulation layer 244 is, for instance, silicon oxide, phosphosilicate glass, borophosphosilicate glass, or other suitable dielectric materials, and the forming method thereof is, for instance, a chemical vapor deposition method. Then, a plurality of plugs 246 respectively electrically connected to the drain region 242 is formed in the interlayer insulation layer 244. The material of the plugs 246 is, for instance, a conductive material such as aluminum or tungsten.

The steps of forming the plugs 246 in the interlayer insulation layer 244 are as follows. First, a portion of the interlayer insulation layer 244 is removed to form an opening exposing the drain region 242. Then, a conductive material layer (not shown) completely filled in the opening is formed on the substrate 200. Then, a portion of the conductive material layer is removed via a chemical mechanical polishing method or an etch-back method until the interlayer insulation layer 244 is exposed. In particular, the forming method of the opening is, for instance, a photolithoetching technique.

Next, a bit line 248 is formed on the interlayer insulation layer 244. The bit line 248 is electrically connected to the drain region 242 via the plugs 246. The material of the bit line 248 is, for instance, a conductive material such as aluminum, tungsten, or copper. The forming method of the bit line 248 includes, for instance, forming a conductive layer (not shown) on the substrate 200, and then patterning the conductive layer to form the bit line 248. The forming method of the conductive layer is, for instance, a physical vapor deposition method or a chemical vapor deposition method.

In the manufacturing method of a non-volatile memory of the invention, the structures of two adjacent memory cells in the X direction (horizontal direction) are the same and the two memory cells are, for instance, disposed as mirror images of each other, and the two memory cells share the source region or the drain region, and share the control gate. The structures of two adjacent memory cells in the Y direction (vertical direction) are the same, and the two memory cells share the source region, the gate dielectric layer, the assist gate (word line), the insulation layer, the erase gate, and the control gate. Therefore, the density of the device can be increased.

In the manufacturing method of a non-volatile memory of the invention, the formed assist gate and erase gate form each of the stacked structures, and therefore the density of the device can be increased.

In the above manufacturing method of a non-volatile memory, the thickness of the gate dielectric layer below the formed assist gate is less, and during the operation of the memory cells, a smaller voltage can be used to open/close the channel region below the assist gate. That is, the operating voltage can be reduced. The formed control gate covers the floating gate, and therefore the area between the control gate and the floating gate can be increased, such that the coupling ratio of the memory device is increased. The floating gate has a corner portion. The erase gate covers the corner portion, the angle of the corner portion is less than or equal to 90 degrees, and an electric field can be concentrated via the corner portion, and therefore the erase voltage can be reduced, thus effectively pulling out electrons from the floating gate, and as a result the speed of erasing data is increased.

Figure 3A:
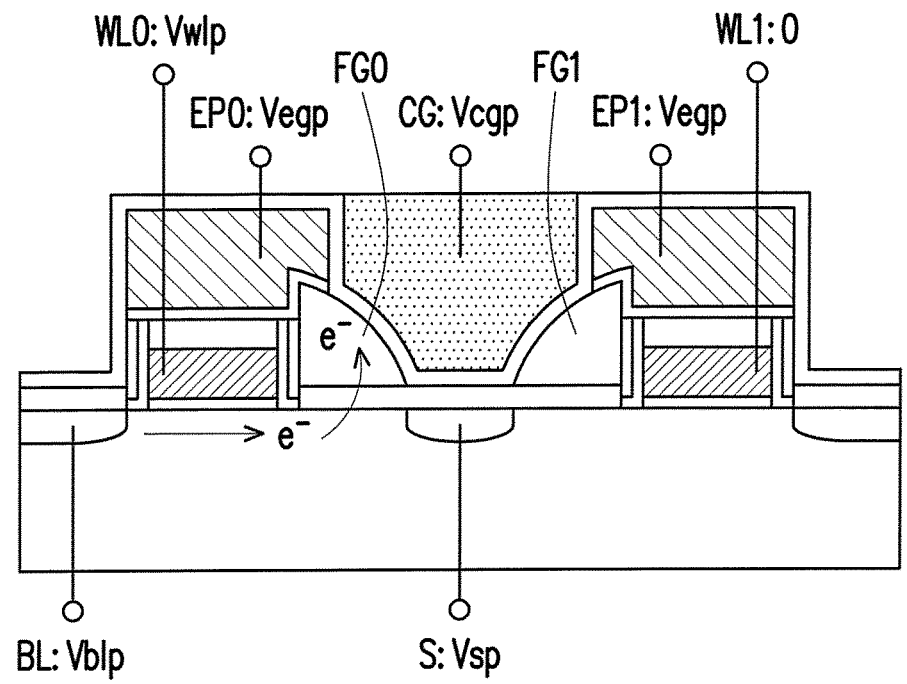
FIG. 3A is a schematic of a programming operation performed on memory cells according to an embodiment.
Figure 3B:
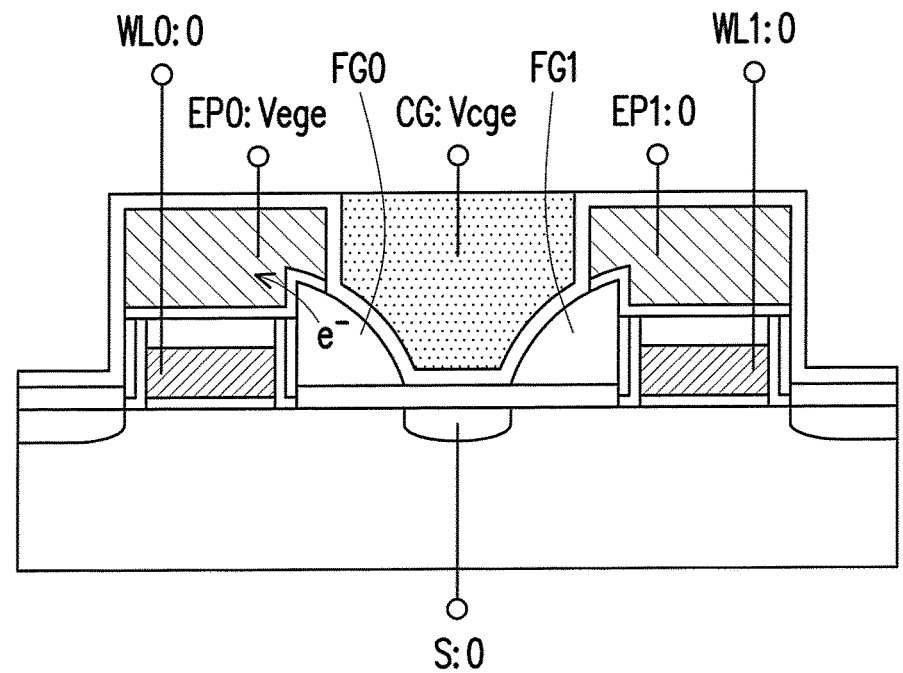
FIG. 3B is a schematic of an erase operation performed on memory cells according to an embodiment.
Figure 3C:
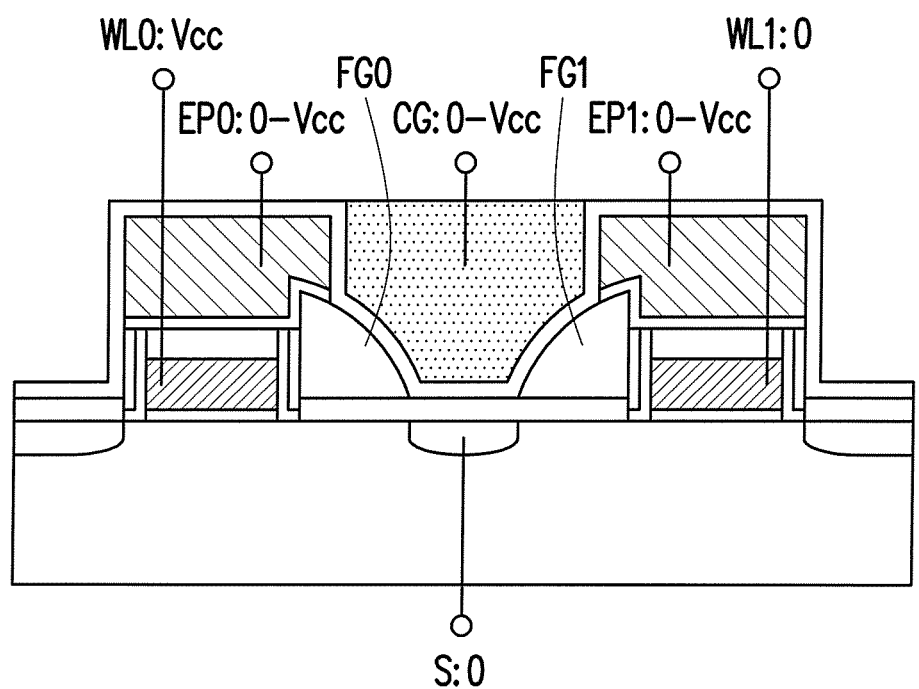
FIG. 3C is a schematic of a read operation performed on memory cells according to an embodiment.

Next, the operation modes of the non-volatile memory of the invention are described, including operation modes such as programming, erasing, and data reading. FIG. 3A is a schematic of a programming operation performed on memory cells according to an embodiment. FIG. 3B is a schematic of an erase operation performed on memory cells according to an embodiment. FIG. 3C is a schematic of a read operation performed on memory cells according to an embodiment.

Referring to FIG. 3A, during a programming operation, a voltage Vwlp is applied to an assist gate WL0 of a selected memory cell to form a channel in the substrate below the assist gate, and the voltage Vwlp is, for instance, 0.6 volts to 1.2 volts. A voltage of 0 volts is applied to an assist gate WL1 of a non-selected memory cell. A voltage Vsp is applied to a source region S; a voltage Vcgp is applied to a control gate CG; and a voltage Vegp is applied to an erase gate EP0 of the selected memory cell and an erase gate EP1 of the non-selected memory cell. The voltage Vsp is, for instance, 3 volts to 7 volts; the voltage Vcgp is, for instance, 5 volts to 9 volts; and the voltage Vegp is, for instance, 3 volts to 7 volts. Under such bias voltage, electrons are moved from the drain to the source and injected into a floating gate FG0 of the selected memory cell via a mode in which hot electrons are injected from the source side. Since a voltage of 0 volts is applied to the assist gate WL1 of the non-selected memory cell, a channel region cannot be formed, and electrons cannot be injected into a floating gate FG1 of the non-selected memory cell, and therefore the non-selected memory cell is not programmed.

Referring to FIG. 3B, during an erase operation, a voltage Vcge is applied to the control gate CG; a voltage Vege is applied to the erase gate EP0 of the selected memory cell; and a voltage of 0 volts is applied to the erase gate EP1 of the non-selected memory cell. The voltage Vege is, for instance, 6 volts to 12 volts; and the voltage Vcge is, for instance, −8 volts to 0 volts. A Fowler-Norheim tunneling effect is triggered via the voltage difference between the control gate CG and the erase gate EP0 to pull out and remove the electrons of the floating gate FG0 stored in the memory cell.

Referring to FIG. 4C, during a read operation, a voltage Vcc is applied to the assist gate WL0 of the selected memory cell; a voltage of 0-Vcc is applied to the control gate CG; a voltage of 0-Vcc is applied to the erase gate EP0 of the selected memory cell; and a voltage of 0-Vcc is applied to the erase gate EP1 of the non-selected memory cell. In particular, the voltage Vcc is, for instance, a supply voltage. In the above case of bias voltage, digital information stored in the memory cell can be determined by detecting the size of the channel current of the memory cell.

In the operation method of the non-volatile memory of the invention, during a programming operation, a low voltage is applied to the assist gate, and a channel can therefore be formed in the substrate below the assist gate, such that electrons are written into the floating gate in a mode in which hot electrons are injected from the source side. During an erase operation, data is erased via the erase gate, such that electrons are removed via the erase gate dielectric layer, and therefore the number of times electrons pass through the tunneling dielectric layer can be reduced, thus increasing reliability. Moreover, the floating gate has a corner portion, and the erase gate covers the corner portion. The angle of the corner portion is less than or equal to 90 degrees, and an electric field can be concentrated via the corner portion, thus effectively pulling out electrons from the floating gate, and as a result the speed of erasing data is increased.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A non-volatile memory, comprising:
    a first memory cell disposed on a substrate, wherein the first memory cell comprises:
        a stacked gate structure comprising a gate dielectric layer, an assist gate, an insulation layer, and an erase gate disposed on the substrate in order;
        a floating gate disposed on a sidewall of a first side of the stacked gate structure, wherein a top portion of the floating gate has a corner portion, and the erase gate covers the corner portion;
        a tunneling dielectric layer disposed between the floating gate and the substrate;
        an erase gate dielectric layer disposed between the erase gate and the floating gate;
        two isolation material layers respectively disposed at both sides of the gate dielectric layer, the assist gate, and the insulation layer, wherein one of the two isolation material layers disposed between the assist gate and the floating gate is an assist gate dielectric layer;
        a source region and a drain region respectively disposed in the substrate at two sides of the stacked gate structure and the floating gate, wherein the source region is adjacent to the floating gate, the drain region is adjacent to a second side of the stacked gate structure, and the first side and the second side are opposite to each other;
        a control gate disposed on the source region and the floating gate; and
        an inter-gate dielectric layer disposed between the control gate and the floating gate and between the control gate and the erase gate,
    wherein the erase gate covers the top surfaces of the two isolation material layers.

2. The non-volatile memory of claim 1, further comprising:
    a second memory cell disposed on the substrate, wherein a structure of the second memory cell is the same as a structure of the first memory cell, and the second memory cell and the first memory cell are disposed as mirror images of each other and share the source region or the drain region.

3. The non-volatile memory of claim 2, wherein the first memory cell and the second memory cell share the control gate, and the control gate is completely filled in an opening between the first memory cell and the second memory cell.

4. The non-volatile memory of claim 1, further comprising:
    a third memory cell disposed on the substrate, wherein a structure of the third memory cell is the same as a structure of the first memory cell, the third memory cell and the first memory cell share the source region, the assist gate, the erase gate, and the control gate, and the control gate is completely filled between the floating gate of the first memory cell and the floating gate of the third memory cell.

5. The non-volatile memory of claim 1, wherein the tunneling dielectric layer is further disposed between the control gate and the source region.

6. The non-volatile memory of claim 1, wherein a thickness of the assist gate dielectric layer is greater than or equal to a thickness of the erase gate dielectric layer.

7. The non-volatile memory of claim 1, wherein a material of the assist gate dielectric layer comprises silicon oxide/silicon nitride, silicon oxide/silicon nitride/silicon oxide, or silicon oxide.

8. The non-volatile memory of claim 1, wherein a material of the insulation layer comprises silicon oxide.

9. The non-volatile memory of claim 1, wherein a material of the inter-gate dielectric layer comprises silicon oxide/silicon nitride/silicon oxide, silicon nitride/silicon oxide, or other high-dielectric constant materials (k>4).

10. The non-volatile memory of claim 1, wherein a material of the tunneling dielectric layer comprises silicon oxide, and a thickness of the tunneling dielectric layer is between 60 angstroms and 200 angstroms.

11. The non-volatile memory of claim 1, wherein a material of the gate dielectric layer comprises silicon oxide, and a thickness of the gate dielectric layer is less than or equal to a thickness of the tunneling dielectric layer.

12. The non-volatile memory of claim 1, wherein a material of the erase gate dielectric layer comprises silicon oxide, and a thickness of the erase gate dielectric layer is between 100 angstroms and 180 angstroms.

13. The non-volatile memory of claim 1, wherein an angle of the corner portion is less than or equal to 90 degrees.

14. The non-volatile memory of claim 1, wherein the erase gate dielectric layer is further disposed between the erase gate and the assist gate.

15. The non-volatile memory of claim 1, wherein the erase gate located on the insulation layer and part of the floating gate, covering the corner portion, and the control gate located on the source region and part of the floating gate, without covering the corner portion.

* * * * *